(12) United States Patent
Wang et al.

(10) Patent No.: US 10,529,750 B2
(45) Date of Patent: Jan. 7, 2020

(54) LTPS ARRAY SUBSTRATE AND METHOD FOR PRODUCING THE SAME

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventors: Cong Wang, Guangdong (CN); Peng Du, Guangdong (CN)

(73) Assignees: Shenzhen China Star Optoelectronics Technology Co., Ltd, Shenzhen, Guangdong (CN); Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 0 days.

(21) Appl. No.: 15/863,993

(22) Filed: Jan. 8, 2018

(65) Prior Publication Data

US 2018/0130832 A1    May 10, 2018

Related U.S. Application Data

(62) Division of application No. 14/760,750, filed on Jul. 14, 2015, now Pat. No. 9,893,096.

(51) Int. Cl.
| | |
|---|---|
| *H01L 27/12* | (2006.01) |
| *H01L 29/786* | (2006.01) |
| *H01L 29/66* | (2006.01) |
| *H01L 21/28* | (2006.01) |
| *H01L 21/84* | (2006.01) |

(52) U.S. Cl.
CPC .......... *H01L 27/1288* (2013.01); *H01L 21/28* (2013.01); *H01L 27/124* (2013.01); *H01L 29/66765* (2013.01); *H01L 29/78678* (2013.01)

(58) Field of Classification Search
CPC ......... H01L 29/78678; H01L 29/66765; H01L 27/1288; H01L 27/124
See application file for complete search history.

(56) References Cited

U.S. PATENT DOCUMENTS

| | | | | |
|---|---|---|---|---|
| 2009/0057672 A1* | 3/2009 | Kobayashi | .............. | H01L 29/04 257/59 |
| 2012/0298518 A1* | 11/2012 | Joo | .......................... | C25D 5/04 205/137 |

(Continued)

*Primary Examiner* — Marcos D. Pizarro
*Assistant Examiner* — Antonio B Crite
(74) *Attorney, Agent, or Firm* — Andrew C. Cheng

(57) ABSTRACT

An LTPS array substrate includes: a substrate on which a gate is disposed. An insulating layer and a polycrystalline silicon layer are disposed in sequence on the substrate and the gate. The insulating layer has an upper surface that is a plane. A source and a drain are disposed on the polycrystalline silicon layer and a pixel electrode is disposed on the insulating layer and a part of the drain. A plain passivation layer is disposed on the source and drain and includes a contact via formed therein at a location outside the polycrystalline silicon layer to expose a surface of one of the gate, the source, and the drain. A transparent electrode layer is disposed on the plain passivation layer to be electrically connected to the surface of the one of the gate, the source, and the drain that is exposed through the contact via.

10 Claims, 5 Drawing Sheets

(56) References Cited

U.S. PATENT DOCUMENTS

| | | | |
|---|---|---|---|
| 2013/0168683 A1* | 7/2013 | Seo | H01L 29/66765 |
| | | | 257/66 |
| 2015/0084013 A1* | 3/2015 | Ohmi | H01L 51/0512 |
| | | | 257/40 |
| 2016/0276377 A1* | 9/2016 | Sun | H01L 27/124 |
| 2016/0293770 A1* | 10/2016 | Peng | H01L 29/78621 |
| 2016/0358943 A1* | 12/2016 | Okada | G02F 1/1368 |

* cited by examiner

LTPS ARRAY SUBSTRATE AND METHOD FOR PRODUCING THE SAME

CROSS REFERENCE TO RELATED APPLICATIONS

This is a divisional application of co-pending patent application Ser. No. 14/760,750, filed on Jul. 14, 2015, which is a national stage of PCT application number PCT/CN2015/081634, filed on Jun. 17, 2015, claiming foreign priority of Chinese patent application number 201510310588.5, filed on Jun. 8, 2015.

BACKGROUND OF THE INVENTION

1. Field of the Invention

The present invention relates to the field of display technology, and more particularly, to a low temperature poly-silicon (LTPS) array substrate and a method for producing the LTPS array substrate.

2. Description of Prior Art

Higher electron mobility is demonstrated in a liquid crystal display (LCD) adopting LTPS. The size of a thin film transistor (TFT) is actually smaller in this kind of LCD in which the aperture rate of a pixel is higher, and the brightness is larger. Anyway, power consumption and production costs are less using an LCD with LTPS. Owing to these features, the research on the LCD with LTPS is popular in LCD technology. However, the LTPS technology is sophisticated. It requires a lot of masks in various types to fabricate an array substrate (array substrate). Also, it needs many processes to produce an array substrate. Therefore, production costs are always high, which is a problem. To find ways to reduce the masks used in the LTPS technology in numbers and types requires the whole industry to work out.

SUMMARY OF THE INVENTION

In view of this, an LTPS array substrate and a method for producing the LTPS array substrate is proposed by the embodiment of the present invention for the purpose of reducing the masks used in the LTPS technology in types and in numbers.

According to a preferred embodiment of the present invention, a method for producing a low temperature poly-silicon (LTPS) array substrate comprises: forming a gate of a thin-film transistor (TFT) of the LTPS array substrate on a substrate; forming a buffer layer on the substrate without being covered by the gate and forming a plane using an upper surface of the buffer layer and an upper surface of the gate; forming an insulating layer, a semiconductor layer, and a first positive photoresist layer on the substrate one by one in which an upper surface of the insulating layer is a plane; exposing one side of the substrate on an opposite of the gate for only preserving the first positive photoresist layer disposed on a first section disposed right above the gate; injecting first impurity ions into the semiconductor layer outside the first section; exposing one side of the substrate on the opposite side of the gate for forming the first positive photoresist layer disposed on a second section disposed right above the gate, and the second section being smaller than the first section; injecting second impurity ions into the semiconductor layer outside the second section; removing the first positive photoresist layer disposed on the second section to form a polycrystalline silicon layer; forming a source and a drain of the TFT on the polycrystalline silicon layer; forming a pixel electrode on the insulating layer and part of the source; forming a plain passivation layer on a source-drain electrode layer, which is fabricated from the source and the drain, and forming a contact via in the plain passivation layer for exposing surfaces of the gate, the source, and the drain, and the contact via being disposed outside the polycrystalline silicon layer; forming a transparent electrode layer on the plain passivation layer so that the transparent electrode layer can be electrically connected to the gate, the source, and the drain via the contact hole.

Furthermore, a step of forming the buffer layer on the substrate without being covered by the gate comprises: forming the buffer layer and a negative photoresist layer on the substrate one by one; exposing one side of the substrate on the opposite side of the gate for removing the negative photoresist layer disposed right above the gate; removing the buffer layer disposed right above the gate, and preserving the buffer layer on the substrate without being covered by the gate.

Furthermore, a step of forming the buffer layer on the substrate without being covered by the gate comprises: forming the buffer layer and a second positive photoresist layer on the substrate one by one; exposing one side of the substrate facing the gate for removing the second positive photoresist layer disposed right above the gate; removing the buffer layer disposed right above the gate, and preserving the buffer layer on the substrate without being covered by the gate.

Furthermore, after removing the first positive photoresist layer on the second section, the method further comprises: coating a photoresist layer on the polycrystalline silicon layer and exposing the photoresist layer based on a desired pattern; etching the polycrystalline silicon layer without the desired pattern; removing the remaining photoresist layer.

Furthermore, the first impurity ions are N+ type impurity ions, and the second impurity ions are N− type impurity ions.

According to another embodiment of the present invention, a method for producing a low temperature poly-silicon (LTPS) array substrate, comprises: forming a gate of a thin-film transistor (TFT) of the LTPS array substrate on a substrate; forming an insulating layer, a semiconductor layer, and a first positive photoresist layer on the substrate one by one in which an upper surface of the insulating layer is a plane; exposing one side of the substrate on the opposite side of the gate for forming a polycrystalline silicon layer; forming a source and a drain of the TFT on the polycrystalline silicon layer; forming a pixel electrode on the insulating layer and part of the source; forming a plain passivation layer on a source-drain electrode layer, which is fabricated from the source and the drain, and forming a contact via in the plain passivation layer for exposing surfaces of the gate, the source, and the drain, and the contact via being disposed outside the polycrystalline silicon layer; forming a transparent electrode layer on the plain passivation layer so that the transparent electrode layer can be electrically connected to the gate, the source, and the drain via the contact hole.

Furthermore, before the insulating layer is formed on the substrate of the gate, the method further comprises: forming a buffer layer on the substrate without being covered by the gate and forming a plane using an upper surface of the buffer layer and an upper surface of the gate.

Furthermore, a step of forming the buffer layer on the substrate without being covered by the gate comprises:

forming the buffer layer and a negative photoresist layer on the substrate one by one; exposing one side of the substrate on the opposite side of the gate for removing the negative photoresist layer disposed right above the gate; removing the buffer layer disposed right above the gate, and preserving the buffer layer on the substrate without being covered by the gate.

Furthermore, a step of forming the buffer layer on the substrate without being covered by the gate comprises: forming the buffer layer and a second positive photoresist layer on the substrate one by one; exposing one side of the substrate facing the gate for removing the second positive photoresist layer disposed right above the gate; removing the buffer layer disposed right above the gate, and preserving the buffer layer on the substrate without being covered by the gate.

Furthermore, a step of exposing one side of the substrate on the opposite side of the gate for forming a polycrystalline silicon layer comprises: exposing one side of the substrate on the opposite of the gate for only preserving the first positive photoresist layer disposed on a first section disposed right above the gate; injecting first impurity ions into the semiconductor layer outside the first section; exposing one side of the substrate on the opposite side of the gate for forming the first positive photoresist layer disposed on a second section disposed right above the gate, and the second section being smaller than the first section; injecting second impurity ions into the semiconductor layer outside the second section; removing the first positive photoresist layer disposed on the second section.

Furthermore, after removing the first positive photoresist layer on the second section, the method further comprises: coating a photoresist layer on the polycrystalline silicon layer and exposing the photoresist layer based on a desired pattern; etching the polycrystalline silicon layer without the desired pattern; removing the remaining photoresist layer.

Furthermore, the first impurity ions are N+ type impurity ions, and the second impurity ions are N− type impurity ions.

Furthermore, steps of exposing one side of the substrate on the opposite side of the gate for forming the polycrystalline silicon layer comprise: exposing one side of the substrate on the opposite side of the gate for only preserving the first positive photoresist layer disposed on a first section disposed right above the gate; injecting P− type impurity ions into the semiconductor layer outside the first section; exposing one side of the substrate on the opposite side of the gate for forming the first positive photoresist layer disposed on a second section disposed right above the gate, and the second section being smaller than the first section; removing the first positive photoresist layer disposed on the second section.

According to another embodiment of the present invention, a low temperature poly-silicon (LTPS) array substrate, comprises: a substrate; a gate, disposed on the substrate; forming an insulating layer and a polycrystalline silicon layer on the substrate one by one in which an upper surface of the insulating layer is a plane; a source and a drain, disposed on the polycrystalline silicon layer; a pixel electrode, disposed on the insulating layer and part of the source; a plain passivation layer, disposed on a source-drain electrode layer fabricated from the source and the drain, and a contact via formed in the plain passivation layer for exposing surfaces of the gate, the source, and the drain, the contact via disposed outside the polycrystalline silicon layer; a transparent electrode layer, disposed on the plain passivation layer, and the transparent electrode layer being electrically connected to the gate, the source, and the drain via the contact hole.

Furthermore, the LTPS array substrate further comprises a buffer layer, the buffer layer is disposed on the substrate without being covered by the gate, and an upper surface of the buffer layer and an upper surface of the gate form a plane.

The fact about the LTPS array substrate and the method for producing the LTPS array substrate proposed by the present invention is that one side of a substrate on the opposite side of a gate is exposed for forming a polycrystalline silicon layer. In other words, an opaque gate is exposed for forming a polycrystalline silicon layer. It is unnecessary to use any masks in producing polycrystalline silicon layers so the use of masks in types and in numbers in the LTPS technology will be reduced. So, both of the processes and the production costs are reduced.

DETAILED DESCRIPTION OF THE PREFERRED EMBODIMENTS

The drawings illustrate embodiments of the invention and, together with the description, serve to explain the principles of the invention.

Figure 1:
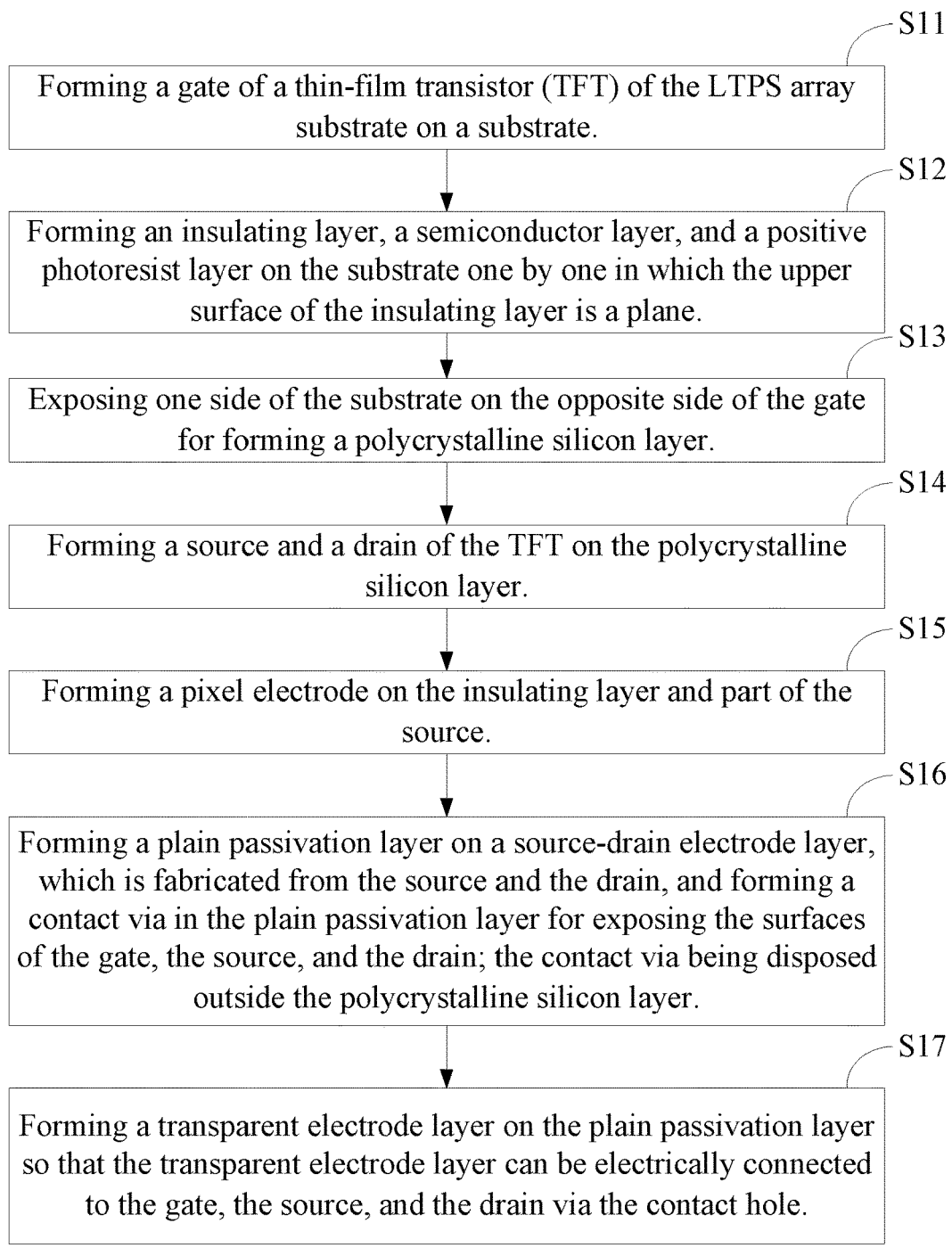
FIG. 1 is a flow chart of a method for producing an LTPS array substrate according to a preferred embodiment of the present invention.

FIG. 1 is a flow chart of a method for producing an LTPS array substrate according to a preferred embodiment of the present invention. The method comprises the following steps:

Step 11: forming a gate of a thin-film transistor (TFT) of the LTPS array substrate on a substrate.

Figure 2:
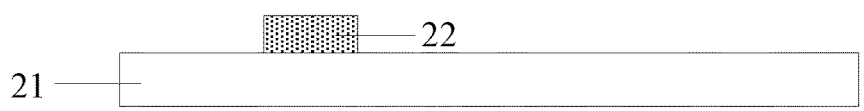
FIG. 2 shows a process of forming a gate according to the present invention.

Referring to FIG. 2, the substrate 21 is used for forming the LTPS array substrate of the LCD panel. The substrate 21 can be a glass substrate, a plastic substrate, or a flexible substrate.

A first metallic layer is formed on the substrate 21 and the first metallic layer is exposed through a first mask in this embodiment. The exposed first metallic layer is patterned after being developed and etched. Then, a gate 22 is formed. The first metallic layer is etched with etching liquid comprising phosphoric acid, nitric acid, acetic acid, and deionized water. Definitely, the first metallic layer can undergo dry etching as well.

The gate 22 can be acquired through other methods as well, such as chemical vapor deposition (CVD), plasma enhanced chemical vapor deposition (PECVD), sputtering, vacuum evaporation deposition, and low pressure chemical vapor deposition (LP-CVD). The method of deposition is not confined in the specification. The gate 22 with a desired pattern is formed on the substrate 21 directly. The first metallic layer is fabricated from a metal, such as aluminum (AL), molybdenum (Mo), titanium (Ti), chromium (Cr), and cuprum (Cu). Or, the first metallic layer is fabricated from a metallic oxide, such as titanium oxide, or metallic alloy or other conducting materials.

Step 12: forming an insulating layer, a semiconductor layer, and a positive photoresist layer on the substrate one by one in which the upper surface of the insulating layer is a plane.

Figure 3:
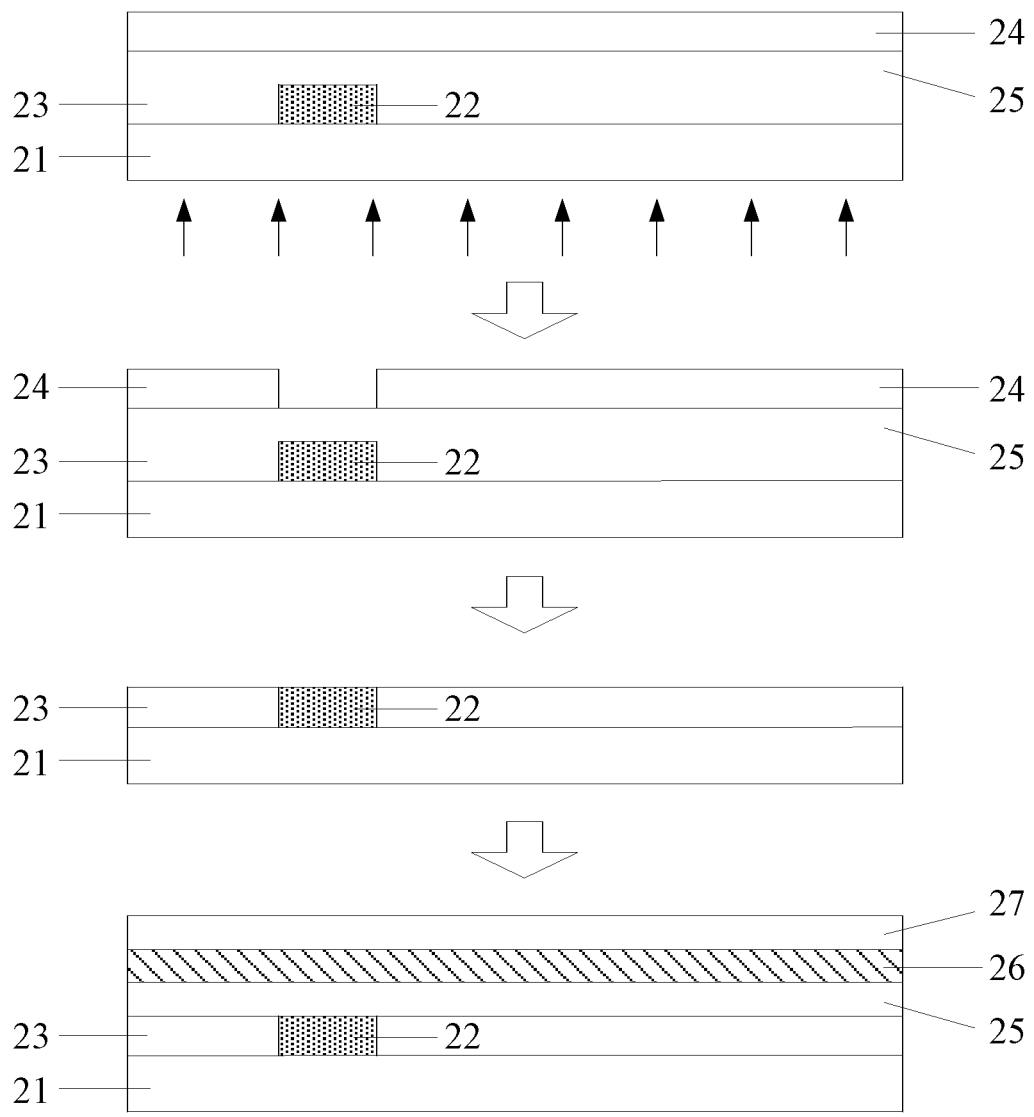
FIG. 3 shows a process of forming an insulating layer, a semiconductor layer, and a positive photoresist formed on the substrate according to the present invention.

Referring to FIG. 3 as well, a buffer layer 23 needs to be formed on the substrate 21 without being covered by the gate 22 before the insulating layer 25, the semiconductor layer 26, and the positive photoresist layer 27 are formed in this embodiment. The concrete processes are described below while it does not mean that the processes are limited.

Firstly, the buffer layer 23 and a negative photoresist layer 24 are formed on the substrate 21 of the gate 22 one by one. The buffer layer 23 can be a $SiN_x$ layer, a $SiO_x$ layer or the combination of other non-conducting materials. The buffer layer 23 is used for preventing upward spreading of the impurity in the substrate 21 in the following processes so that the quality of a LTPS layer which will be formed in the following processes will not be affected. The $SiN_x$ layer and the $SiO_x$ layer are deposited through CVD, PECVD, sputtering, vacuum evaporation deposition, or LP-CVD. The method of deposition is not confined in the specification.

Next, one side of the substrate 21 on the opposite side of the gate 22 is exposed. The negative photoresist layer 24 disposed right above the gate 22 is not exposed under the shelter of the gate 22 so the negative photoresist layer 24 can be removed with ash after being developed.

Finally, the remaining negative photoresist layer 24 is lifted off. The buffer layer 23 disposed right above the gate 22 is etched and removed. Therefore, the buffer layer 23 without being covered by the gate 22 is preserved.

The present embodiment further proposes a method for forming the buffer layer 23. It is as follows:

Firstly, the buffer layer 23, the positive photoresist layer, the positive photoresist layer 27 relatively formed on the semiconductor layer 26 are formed on the substrate 21 of the gate 22 one by one. The positive photoresist layer can be understood as the second positive photoresist layer. The positive photoresist layer 27 is the first positive photoresist layer. Then, one side of the substrate 21 facing the gate 22 is exposed to remove the positive photoresist layer disposed right above the gate 22. Finally, the buffer layer 23 disposed right above the substrate 21 is removed. The buffer layer 23 on the substrate without being covered by the gate 22 is preserved.

Step 13: exposing one side of the substrate on the opposite side of the gate for forming a polycrystalline silicon layer.

Figure 4:
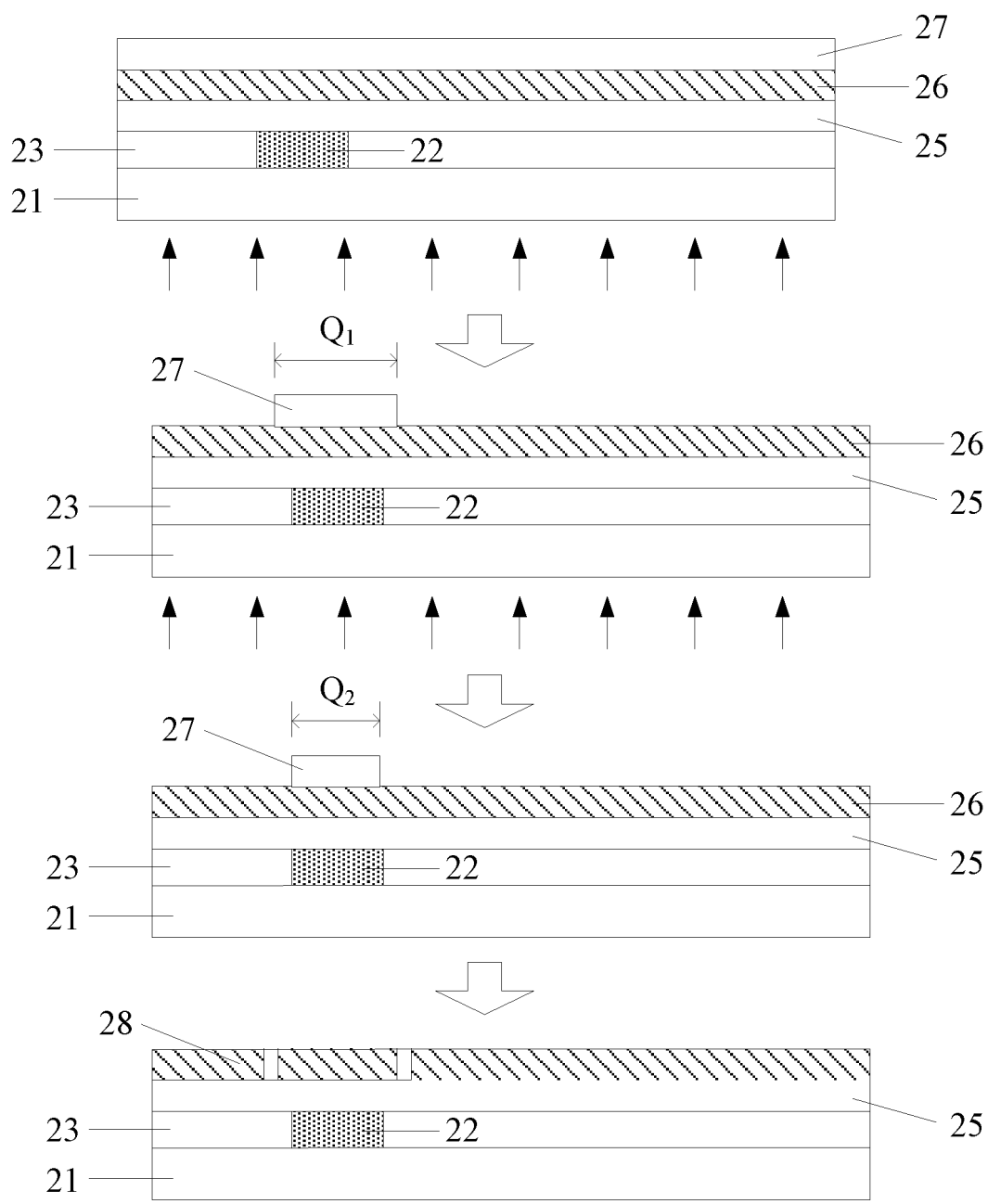
FIG. 4 shows a process of forming a polycrystalline silicon layer according to the present invention.

Referring to FIG. 4 as well, firstly, one side of the substrate 21 on the opposite side of the gate 22 is exposed. The positive photoresist layer 27 disposed on the first section $Q_1$ of the gate 22 is not exposed under the shelter of the gate 22 so the positive photoresist layer 27 is preserved after being developed. The positive photoresist layer 27 without being exposed under the shelter of the gate 22 can be removed with ash after being developed. Therefore, only the positive photoresist layer 27 disposed on the first section $Q_1$ disposed right above the gate 22 is preserved.

Next, first impurity ions are injected into the semiconductor layer 26 outside the first section $Q_1$. In other words, conventionally, the semiconductor layer 26 is heavily doped.

Next, one side of the substrate 21 on the opposite side of the gate 22 is exposed. The intensity of this exposure is larger than the intensity of exposure on the positive photoresist layer 27 formed on the first section $Q_1$. So the positive photoresist layer 27 disposed on both sides of the first section $Q_1$ is removed. The positive photoresist layer 27 of the second section $Q_2$ is formed right above the gate 22. The second section $Q_2$ is smaller than the first section $Q_1$.

Further, second impurity ions are injected into the semiconductor layer 26 outside the second section $Q_2$. In other words, conventionally, the semiconductor layer 26 is softly doped.

Finally, the positive photoresist layer 27 on the second section $Q_2$ is removed.

The first impurity ions in this embodiment can be N+ type impurity ions, and correspondingly, the second impurity ions can be N− type impurity ions. While the first impurity ions are P+ type impurity ions, the doping of the second impurity ion is unnecessary. In other words, soft doping is unnecessary.

Figure 5:
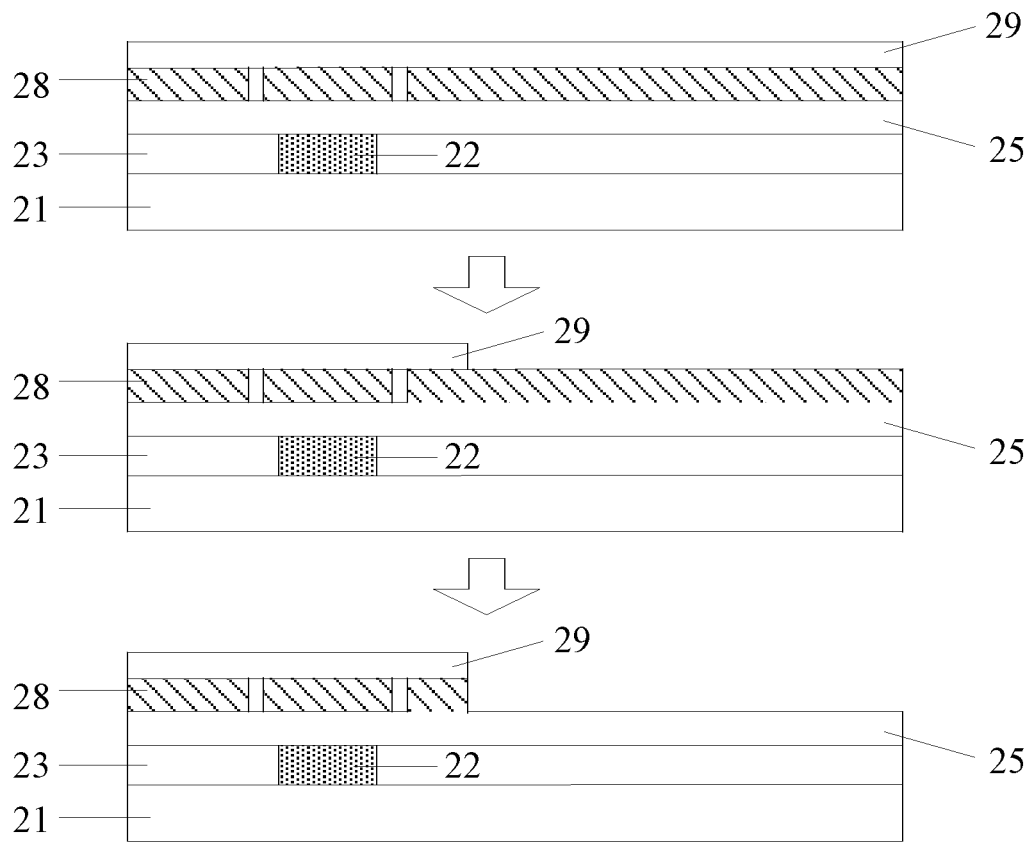
FIG. 5 shows a patterned polycrystalline silicon layer according to the present invention.

After the positive photoresist layer 27 is removed from the second section $Q_2$, a polycrystalline silicon layer 28 is exposed through a second mask for forming a desired pattern on the polycrystalline silicon layer 28. Referring to FIG. 5 as well, a photoresist layer 29 is coated on the polycrystalline silicon layer 28 and exposed. Then, the polycrystalline silicon layer 28 where no desired pattern is formed is etched and removed. Meanwhile, the remaining photoresist layer 29 is removed as well. One side of the substrate 21 on the opposite side of the gate 22 is exposed when the photoresist layer 29 is a positive photoresist layer. One side of the substrate 21 facing the gate 22 is exposed when the photoresist layer 29 is a negative photoresist layer.

Step S14: forming a source and a drain of the TFT on the polycrystalline silicon layer.

Figure 6:
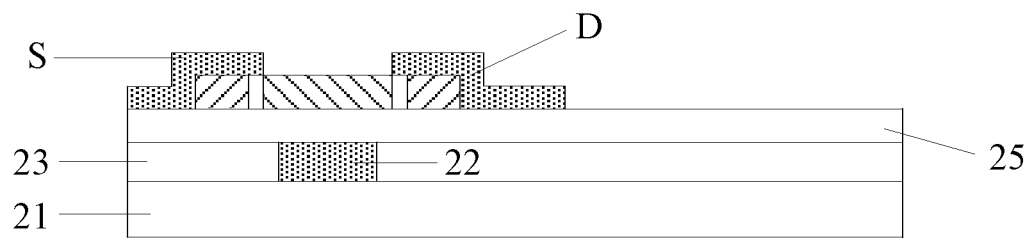
FIG. 6 shows a process of forming a source and a drain according to the present invention.

A source S and a drain D of the TFT are formed through exposure, development, and etching through a third mask in this embodiment, as shown in FIG. 6.

Step S15: forming a pixel electrode on the insulating layer and part of the source.

Figure 7:
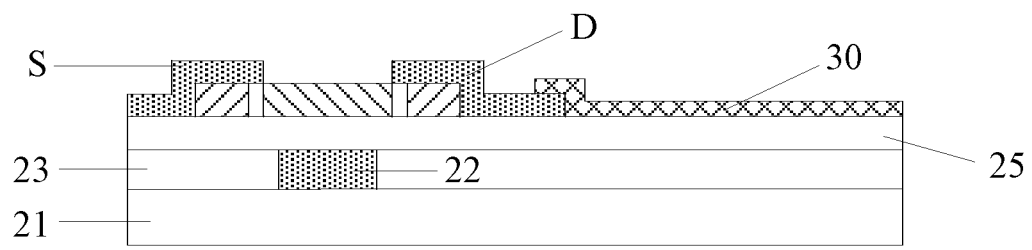
FIG. 7 shows a process of forming a pixel electrode according to the present invention.

A pixel electrode 30 with a desired pattern is formed through exposure, development, and etching through a fourth mask in this embodiment, as shown in FIG. 7.

Step S16: forming a plain passivation layer on a source-drain electrode layer, which is fabricated from the source and the drain, and forming a contact via in the plain passivation layer for exposing the surfaces of the gate, the source, and the drain; the contact via being disposed outside the polycrystalline silicon layer.

Step S17: forming a transparent electrode layer on the plain passivation layer so that the transparent electrode layer can be electrically connected to the gate, the source, and the drain via the contact hole.

Figure 8:
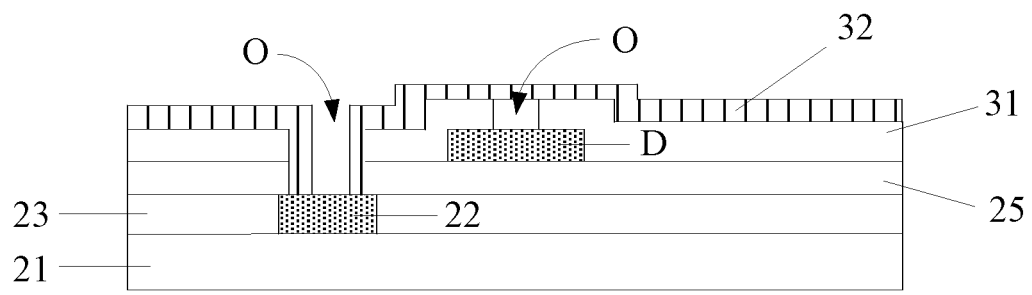
FIG. 8 shows a first cross-sectional view of forming a transparent electrode according to the present invention.
Figure 9:
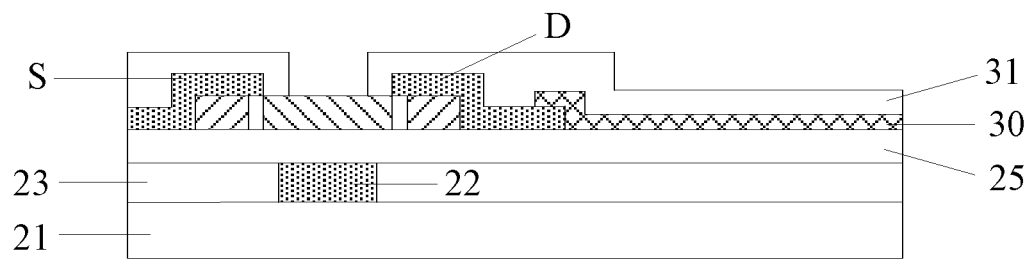
FIG. 9 shows a process of forming a passivation layer according to the present invention.

The plain passivation layer 31 is formed through exposure, development, and etching through a fifth mask in this embodiment, as shown in FIGS. 8 and 9. Referring to FIG. 8, outside the TFT, the plain passivation layer 31 comprises a contact via O. Because of the contact via O, the surfaces of the gate 22, the source S, and the drain D are exposed and electrically connected to wires of the LTPS array substrate.

For example, the gate 22 is correspondingly electrically connected to a gate wire formed on the substrate 21 (array substrate). The source S is correspondingly electrically connected to a data wire formed on the array substrate. The gate wire and the data wire are vertically crossed and form a pixel display section where the pixel electrode 33 is disposed.

Figure 10:
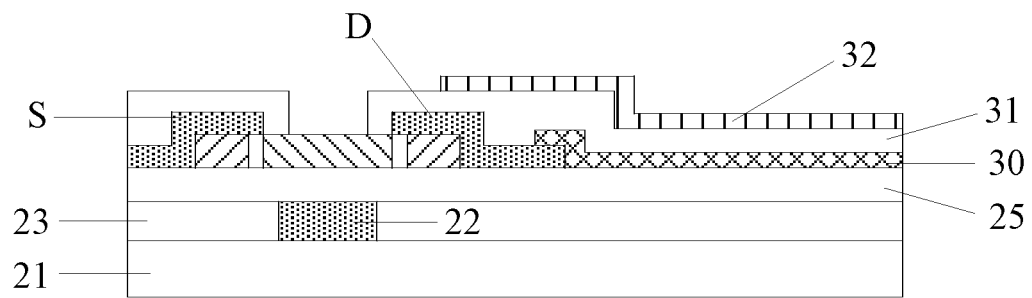
FIG. 10 shows a second cross-sectional view of forming a transparent electrode according to the present invention.

A transparent electrode layer 32 is formed through exposure, development, and etching through a sixth mask in this embodiment, as shown in FIG. 10. The transparent electrode layer 32 and the pixel electrode 30 are fabricated from the same transparent conducting materials and used as a common electrode of the LTPS array substrate.

One side of the substrate 21 on the opposite side of the gate 22 is exposed. In other words, the opaque gate 22 is exposed for forming the polycrystalline silicon layer 28 without using any masks. Therefore, the type and number of masks for producing the LTPS array panel is reduced. It not only simplifies the manufacture procedure but also reduces costs.

The present invention further proposes an LCD panel comprising the LTPS array panel as shown in FIG. 10 and an LCD. The benefit is as what is described above.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure

What is claimed is:

1. A low temperature poly-silicon (LTPS) array substrate, comprising:
   a substrate;
   an opaque gate, which is disposed on the substrate;
   an insulating layer and a polycrystalline silicon layer, which are disposed in sequence on the substrate, wherein the insulating layer has an upper surface that is a plane;
   a source and a drain, which are disposed on the polycrystalline silicon layer and collectively form a source-drain electrode layer;
   a pixel electrode, which is disposed on the insulating layer and a part of the drain;
   a plain passivation layer, which is disposed on the source-drain electrode layer, wherein the plain passivation layer comprises a contact via formed therein at a location outside the polycrystalline silicon layer without extending into the polycrystalline silicon layer to expose a surface of the gate; the plain passivation layer further comprises a hole defined therein to expose at least a portion of the polycrystalline silicon layer; and
   a transparent electrode layer, which is disposed on the plain passivation layer to be electrically connected to the surface of the gate that is exposed through the contact via;
   the polycrystalline silicon layer is formed by exposing the opaque gate without a mask; the polycrystalline silicon layer comprises a first area with a desired pattern and a second area without the desired pattern; the polycrystalline silicon layer is coated with a photoresist layer which is removed after the photoresist layer is exposed and the second area is removed;
   wherein the polycrystalline silicon layer comprises an area that is defined as a first section without first impurity ions doped therein, and an area outside the first section having the first impurity ions doped therein; and
   wherein the gate is located on the substrate and below the polycrystalline silicon layer and the gate has a surface area on the substrate that is smaller than the area of the first section of the polycrystalline silicon layer;
   wherein a buffer layer is disposed on a portion of the substrate that is not covered by the gate, such that an upper surface of the buffer layer is substantially flush with an upper surface of the gate collectively form a plane, and a bottom surface of the buffer layer is substantially flush with a bottom surface of the gate;
   wherein a thickness of the buffer layer is equal to a thickness of the gate;
   wherein the buffer layer is formed of a material comprising one of silicon nitride and silicon oxide.

2. The LTPS array substrate as claimed in claim 1, wherein the first impurity ions comprise P type impurity ions.

3. The LTPS array substrate as claimed in claim 2, wherein a first portion of the polycrystalline silicon layer that comprises the area that is outside the first section is doped with the P type impurity ions.

4. The LTPS array substrate as claimed in claim 1, wherein the gate is formed of a conducting material, which comprises one of a metal, a metal oxide, and a metal alloy.

5. The LTPS array substrate as claimed in claim 4, wherein the metal comprises one of aluminum, molybdenum, titanium, chromium, and copper.

6. The LTPS array substrate as claimed in claim 4, wherein the metal oxide comprises titanium oxide.

7. The LTPS array substrate as claimed in claim 1, wherein the material of the polycrystalline silicon layer is further doped with second impurity ions in a second portion thereof.

8. The LTPS array substrate as claimed in claim 7, wherein the first impurity ions comprise N+ type impurity ions and the second impurity ions comprise N− type impurity ions.

9. The LTPS array substrate as claimed in claim 8, wherein a first portion of the polycrystalline silicon layer that comprises the area that is outside the first section is doped with the N+ type impurity ions.

10. The LTPS array substrate as claimed in claim 9, wherein the material of the polycrystalline silicon layer comprises an area that is located within the first section and defined as a second section that is smaller than the first section and an area outside the second section, wherein the second section matches with the gate and has a surface area same to the surface area of the gate, and the second portion of the polycrystalline silicon layer comprises the area that is outside the second section and doped with the N− type impurity ions.

* * * * *